United States Patent [19]

Kakumu

[11] Patent Number: 4,536,943
[45] Date of Patent: Aug. 27, 1985

[54] METHOD OF MANUFACTURING A FET

[75] Inventor: Masakazu Kakumu, Yokohama, Japan

[73] Assignee: Tokyo Shibaura Denki Kabushiki Kaisha, Kawasaki, Japan

[21] Appl. No.: 496,581

[22] Filed: May 20, 1983

[30] Foreign Application Priority Data

May 21, 1982 [JP] Japan .................................. 57-85937

[51] Int. Cl.³ .................. H01L 21/223; H01L 21/225; H01L 21/265; H01L 21/283
[52] U.S. Cl. ..................................... 29/571; 29/576 B; 29/591; 148/187; 148/188; 148/189; 148/190
[58] Field of Search ............... 148/188, 189, 187, 190; 29/571, 576 B, 591

[56] References Cited

U.S. PATENT DOCUMENTS

| | | | |
|---|---|---|---|
| 3,967,981 | 7/1976 | Yamazaki | 29/571 X |
| 4,127,931 | 12/1978 | Shiba | 29/571 |
| 4,282,647 | 8/1981 | Richman | 148/187 X |
| 4,413,403 | 11/1983 | Ariizumi | 29/571 |
| 4,430,793 | 2/1984 | Hart | 148/188 X |
| 4,431,460 | 2/1984 | Barson et al. | 148/188 X |

Primary Examiner—George T. Ozaki
Attorney, Agent, or Firm—Schwartz, Jeffery, Schwaab, Mack, Blumenthal & Evans

[57] ABSTRACT

In a method of forming electrodes or wiring structures in a semiconductor device, metal and metal silicide are used for electrodes and lead wires, impurities are doped into the interface of a semiconductor substrate from the surface by gas diffusion or solid diffusion irrespective of the thickness, and in the case where the base material is an insulating material, the impurities are not doped into the semiconductor region side by self-alignment.

4 Claims, 17 Drawing Figures

FIG. IA
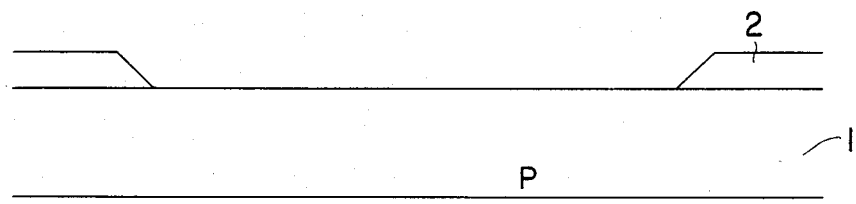
FIG. IB
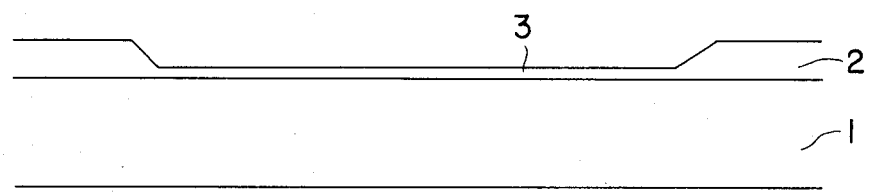
FIG. IC
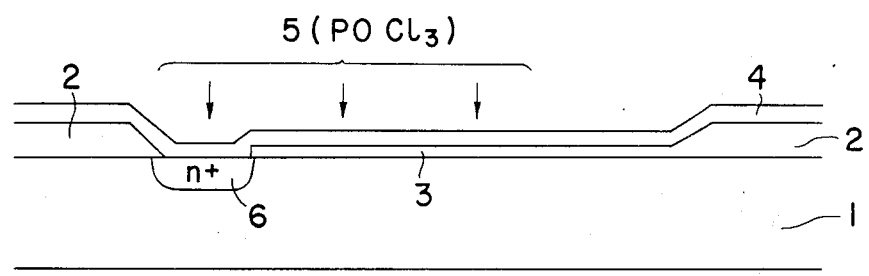
FIG. ID
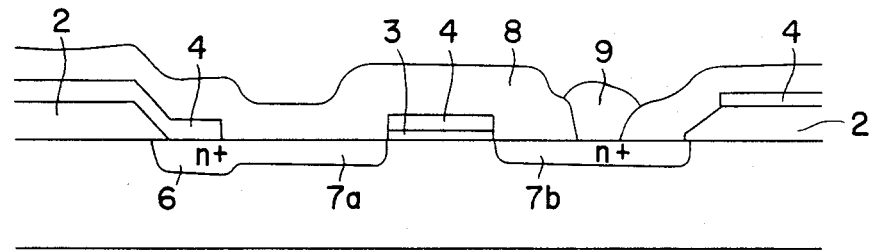

METHOD OF MANUFACTURING A FET

BACKGROUND OF THE INVENTION

This invention relates to methods of manufacturing semiconductor devices, and more particularly to a method of manufacturing semiconductor devices in which the ohmic contacts of wiring portions and electrode portions thereof are improved.

Polycrystal silicon has been extensively employed for forming the electrodes and lead wires of a semiconductor device, because it is excellent in acid resisting characteristic and in heat resisting characteristic and can employ a self-alignment method. However, it has been found that polycrystal silicon is high in specific resistance and not suitable for high speed operation of the element.

On the other hand, special attention has been paid to a method of using metal silicide; however, with metal silicide it is impossible to provide ohmic contacts necessary for wiring. Therefore, a method in which a phosphorus-doped $MoSi_2$ film is used, or a method in which ions are implanted into the interface of an $MoSi_2$ film and an Si substrate, is employed. However, these methods suffer from drawbacks that they cannot use the existing facilities because they are not similar to the method in which polycrystal silicon is used, and that they are high in dangerousness and low in ohmic characteristic.

SUMMARY OF THE INVENTION

In view of the foregoing, an object of this invention is to provide a method of manufacturing a semiconductor device which has electrodes or lead wires of metal and metal silicide and is excellent in the ohmic characteristic of the electrodes or lead wires with respect to the substrate, and which operates at high speed with high reliability.

The foregoing object and other objects of the invention have been achieved by the provision of a method of manufacturing a semiconductor device in which, according to the invention, a step of forming an insulating film on the surface of a semiconductor substrate and simultaneously evaporating metal and silicon on the insulating film and a portion of the substrate surface from which the insulating film is removed, to form films for wiring and electrodes, and a step of introducing a large quantity of impurities into the interface of the semiconductor substrate from the films for wiring and electrodes, are carried out before a step of forming semiconductor regions.

That is, according to the invention, metal and metal silicide are used for electrodes and lead wires, a large amount of impurities are doped into the interface of the semiconductor substrate from the surface by gas diffusion or solid diffusion irrespective of the thickness, to give ohmic characteristics thereto, and in the case where the base material is an insulating material, the impurities are not doped into the semiconductor region side by self-alignment.

The nature, principle and utility of the invention will become more apparent from the following detailed description when read in conjunction with the accompanying drawings.

BRIEF DESCRIPTION OF THE DRAWINGS

In the accompanying drawings:

FIGS. 1A through 1D are explanatory diagrams showing manufacturing steps in a first embodiment of this invention;

DETAILED DESCRIPTION OF THE INVENTION

Figure 2A:
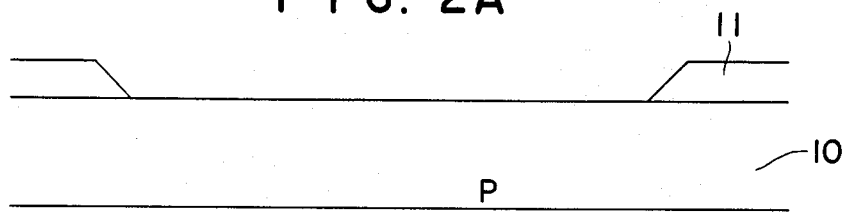
FIGS. 2A through 2D are explanatory diagrams showing manufacturing steps in a second embodiment of the invention.

The invention will be described with reference to its preferred embodiments as shown in the accompanying drawings.

In a first embodiment of the invention, the technical concept of the invention is applied to a method of manufacturing n channel MOS FET's.

As shown in FIG. 1A, a p type silicon substrate 1 is thermally oxidized to form a silicon oxide film 2 about 8000 Å thickness for patterning. Thereafter, oxidization is further carried out to form a gate oxide film 3 about 500 Å in thickness for patterning electrodes as shown in FIG. 1B.

Then, as shown in FIG. 1C, a window is opened by etching a portion of a silicon oxide film 2 so as to form exposed regions, then silicon Si and molybdenum Mo are deposited by evaporation to form an $MoSi_2$ film 4 having a thickness of about 3000 Å. Under this condition, $POCl_3$ is diffused (as indicated by reference numeral 5) from the surface at 900° C. for fourty (40) minutes. As a result, the specific resistance of the $MoSi_2$ film 4 is decreased, while phosphorous P is doped, in a self-alignment manner, into only the formerly exposed regions where the silicon substrate 1 is in contact with the film 4, thus forming a region 6 for ohmic contact.

After a patterning process, ion implantation of arsenic (As) is carried out with 40 KeV, to form a source region 7a and a drain region 7b as shown in FIG. 1D. Finally, an $SiO_2$ film 8 is formed as a passivation film by the CVD method. In addition, an aluminum film 9 is formed for mutual connection wiring and input and output wiring.

The silicon oxide film 2 is used for insulation. Therefore, other materials may be employed.

A second embodiment of the invention, in which the technical concept of the invention is applied to a polycide structure, will be described.

Figure 2B:
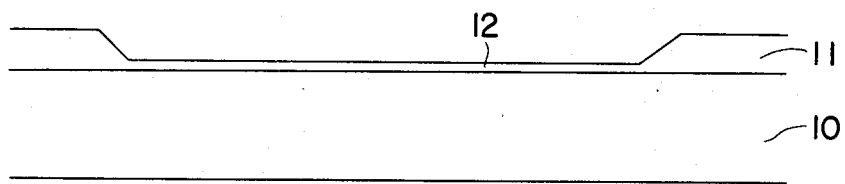

Similarly as in the first embodiment, a gate oxide film 12 is formed on the silicon substrate 10 so as to be integral with silicon oxide film 11 as shown in FIGS. 2A and 2B.

Figure 2C:
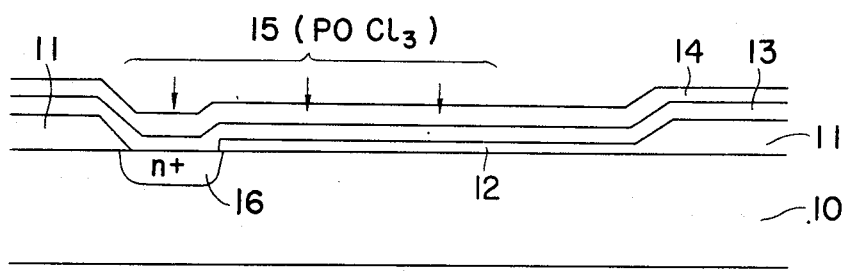
Figure 2D:
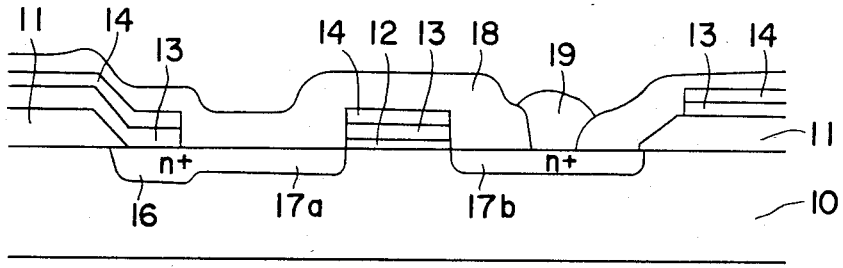

As shown in FIG. 2C, silicon (Si) is deposited by vacuum evaporation to form a polysilicon layer 13 about 2000 Å in thickness, and then silicon (Si) and molybdenum (Mo) are deposited by vaccum evaporation simultaneously to form an MoSi film 14 about 2000 Å in thickness. Under this condition, $POCl_3$ is diffused (indicated at 15) from the surface at 900° C. for fourty (40) minutes, as a result of which a region where the polysilicon layer 13 and the $MoSi_2$ film 14 are in contact with each other and a region where the polysilicon layer 13 is in contact with the silicon substrate 10 becomes ohmic to form an ohmic contact region (16).

After a patterning process, ion implantation of arsenic (As) is carried out with 40 KeV to form a source region 17a and a drain region 17b. Finally, an SiO$_2$ film 18 is formed as a passivation film by the CVD method. In addition, an aluminum film 19 is formed for mutual connection wiring and input and output wiring.

A third embodiment of the invention will be described with reference to FIGS. 3A through 3E. The embodiment is to reduce the source-drain resistance of a MOS transistor, thereby to improve its drive characteristic.

Figure 3A:
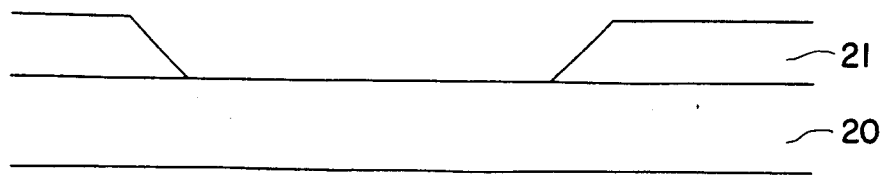
FIGS. 3A through 3E are explanatory diagrams showing manufacturing steps in a third embodiment of the invention.
Figure 3B:
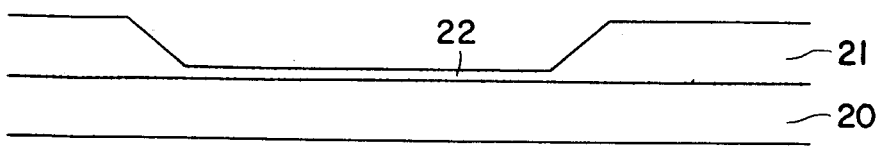

Similarly as in the first or second embodiment, a silicon oxide film 21 and a gate oxide film 22 are formed (FIGS. 3A and 3B).

Figure 3C:
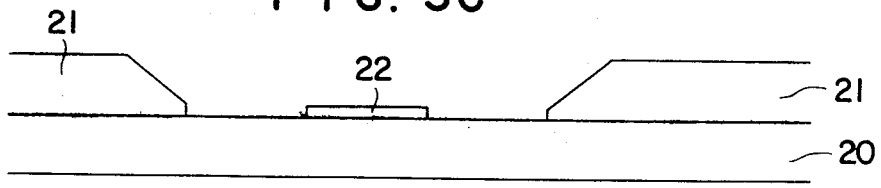

Patterning is carried out as shown in FIG. 3C.

Figure 3D:
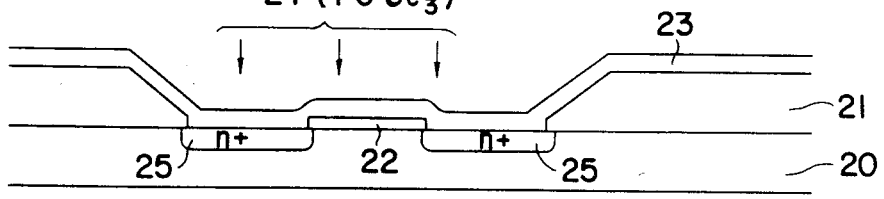

Thereafter, as shown in FIG. 3D, silicon (Si) and molybdenum (Mo) are deposited by vacuum evaporation simultaneously to form an MoSi$_2$ film 23 about 3000 Å in thickness. Under this condition, diffusion of POCl is carried out at 900° C. for fourty minutes (as indicated at 24), as a result of which phosphorus (P) is doped, in a self-alignment manner, only into the region where the silicon substrate 20 is in contact with the film 23, thus forming ohmic contact regions 25.

After a patterning process, ion implantation of arsenic (As) is carried out with 40 KeV, to form a source region 26a and a drain region 26b.

Figure 3E:
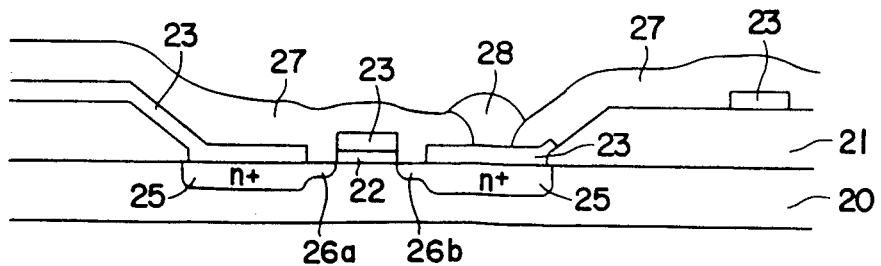

Thereafter, as shown in FIG. 3E, an SiO$_2$ film 27 is formed as a passivation film by the CVD method, and an aluminum film 28 is formed for mutual connection wiring and input and output wiring.

According to the third embodiment, the source-drain resistance can be reduced from 40 $\Omega$/cm$^2$ to 3 $\Omega$/cm$^2$ in the case of an n-channel FET and from 80 $\Omega$/cm$^2$ to 3 $\Omega$/cm$^2$ in the case of a p-channel FET; that is, the drive characteristic of an FET is improved, thus promising a high speed operation thereof.

In the above-described embodiments, n-channel MOS FET's are employed. However, if boron (B) or the like is doped into the MoSi$_2$ film, then the technical concept of the invention can be applied to p-channel MOS FET's. In addition, if two kinds of impurities are doped selectively (for instance, by lithographic technique) thereinto, then the technical concept of the invention can be applied to CMOS's also.

In the above-described embodiments, the MoSi$_2$ film is employed as the gate material; however, the same effect can be obtained with silicides such as WSi$_2$, PtSi, and TiSi$_2$ or metals such as Mo and W.

Figure 4A:
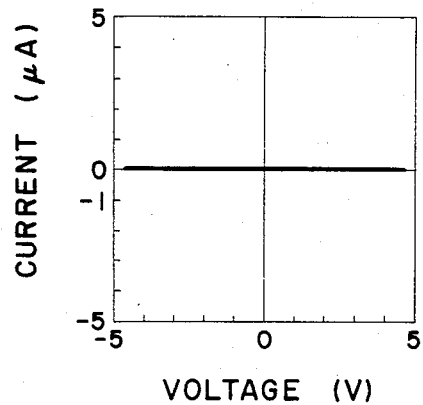
FIGS. 4A, 4B, 5A and 5B are graphical representations for a description of the contact characteristics of semiconductor devices which are manufactured according to the invention.
Figure 4B:
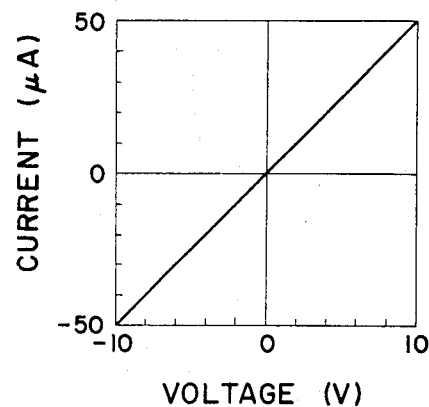
Figure 5A:
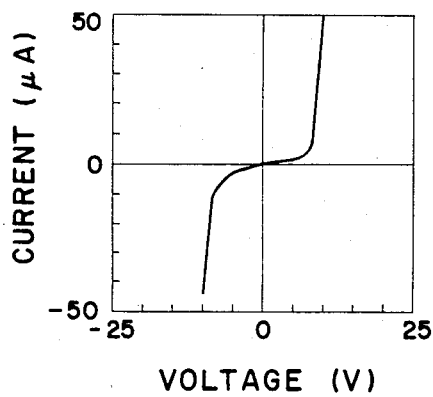
Figure 5B:
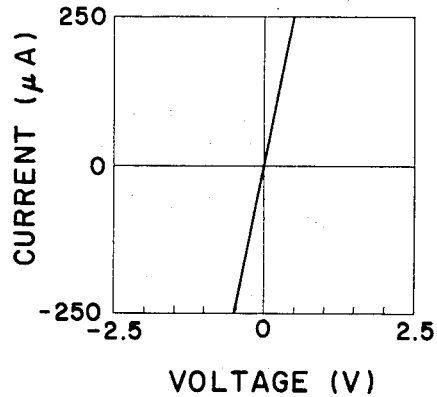

Heretofore, the contact characteristic of silicon and MoSi$_2$ film is insufficient as shown in FIG. 4A; however, it has been improved as shown in FIG. 4B according to the invention. Furthermore, according to the invention, the contact characteristic of polysilicon and MoSi$_2$ film as shown in FIG. 5A is improved into that as shown in FIG. 5B. The contact resistance is also improved to 4 to 6$\times 10^{-7}$ $\Omega$cm$^{-2}$.

In the aforementioned embodiments, molybdenum (Mo) can be utilized for deposition instead of molybdenum and silicon.

As is apparent from the above description, the films for wiring and electrodes are made of metal silicide, and therefore the specific resistance is small when compared with that of the films for wiring and electrodes which are made of polycrystal silicon. Accordingly, the semiconductor device according to the invention is operated at high speed. Furthermore, according to the invention, impurities can be doped, in a self-alignment manner and with high density, in the portion of the silicon substrate where the ohmic contact region is formed, which makes it possible to manufacture high density LSI's. In addition, the phosphorous ions (P$^-$) are included in the gate electrode 4 work as a getter in the insulating film 2, which provides stability and reliability for the gate electrode and improves the threshold value of the transistor.

What is claimed is:

1. A method of manufacturing an FET comprising:
   forming an insulating film on the surface of a semiconductor substrate;
   removing a portion of said insulating film from said substrate surface to form an exposed portion of said substrate;
   forming a conductive film made up of a material selected from the group consisting of tungsten silicide (WSi$_2$), titanium silicide (TiSi$_2$), and platinum silicide (PtSi), on said insulating film and on said exposed portion, by simultaneously evaporating metal and silicon onto said exposed portion and insulating film;
   introducing impurities into the surface of said substrate from outside the substrate through said conductive film so as to form an ohmic contact region at the contacting portion of said substrate and said conductive film; and
   forming a source semiconductor region and a drain semiconductor region of said FET in said substrate by ion-implanting said substrate.

2. A method of manufacturing an FET comprising:
   forming an insulating film on the surface of a semiconductor substrate;
   removing a portion of said insulating film from said substrate surface;
   evaporating silicon on said insulating film and on the portion of said substrate from which said insulating film was removed so as to form a polysilicon layer;
   forming a conductive film made up of a material selected from the group consisting of tungsten silicon (WSi$_2$), titanium silicide (TiSi$_2$), and platinum silicide (PtSi) on said polysilicon layer, by simultaneously evaporating metal and silicon on said polysilicon layer; and
   introducing impurities into the surface of said substrate from outside the substrate through said conductive film so as to form an ohmic contact region at the contacting portion of said substrate and said polysilicon layer.

3. A method of manufacturing a MOSFET comprising:
   forming an insulating film on a first part of the surface of a semiconductor substrate;
   forming a gate oxide film on a second part of the surface of said semiconductor substrate;
   removing a portion of said gate oxide film from said substrate surface to form an exposed portion of said substrate;
   simultaneously evaporating metal and silicon on said insulting film, said exposed portion of said substrate and said gate oxide film so as to form a conductive film on said insulating film, said exposed portion of said substrate, and said gate oxide film;
   diffusing phosphorous into said substrate through said gate oxide film and said conductive film so as to form ohmic contact regions thereon by exposing said gate oxide film and said conductive film to POCl$_3$;

removing a portion of each of said conducting film and said insulating film to separate said films from each other; and ion-implanting As into said substrate so as to form at least two semiconductor regions on opposite sides of said gate oxide film.

4. A method as claimed in claim 3 wherein said at least two semiconductor regions comprise at least one source region and at least one drain region.

* * * * *